(12) United States Patent
Goud et al.

(10) Patent No.: US 10,201,084 B2
(45) Date of Patent: Feb. 5, 2019

(54) PRINTED CIRCUIT BOARD VIA DESIGN

(71) Applicant: DELL PRODUCTS, LP, Round Rock, TX (US)

(72) Inventors: V. Mallikarjun Goud, Secunderabad (IN); Bhyrav M. Mutnury, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 20 days.

(21) Appl. No.: 15/251,699

(22) Filed: Aug. 30, 2016

(65) Prior Publication Data

US 2018/0063944 A1 Mar. 1, 2018

(51) Int. Cl.

| H01R 13/6461 | (2011.01) |
| H05K 1/11 | (2006.01) |
| H05K 1/02 | (2006.01) |
| H01R 13/6467 | (2011.01) |
| H05K 3/00 | (2006.01) |
| H01R 12/73 | (2011.01) |
| H05K 1/14 | (2006.01) |

(52) U.S. Cl.
CPC ......... *H05K 1/115* (2013.01); *H01R 13/6461* (2013.01); *H01R 13/6467* (2013.01); *H05K 1/0245* (2013.01); *H05K 3/0005* (2013.01); *H01R 12/732* (2013.01); *H05K 1/114* (2013.01); *H05K 1/142* (2013.01); *H05K 2201/0949* (2013.01); *H05K 2201/09227* (2013.01); *H05K 2201/10189* (2013.01)

(58) Field of Classification Search
CPC .. H05K 1/115; H05K 1/0245; H01R 13/6461; H01R 13/6467; H01R 13/6469; H01R 13/6471
USPC ........................................ 333/1, 4, 5, 32, 33
See application file for complete search history.

(56) References Cited

U.S. PATENT DOCUMENTS

| 5,911,602 | A | 6/1999 | Vaden |
| 5,967,853 | A | 10/1999 | Hashim |
| 6,652,318 | B1 | 11/2003 | Winings et al. |
| 8,764,464 | B2 | 7/2014 | Buck et al. |
| 2014/0017956 | A1 | 1/2014 | Hashim et al. |
| 2016/0094272 | A1 | 3/2016 | Ye et al. |

FOREIGN PATENT DOCUMENTS

WO    WO 2013/095335 A1    6/2013

*Primary Examiner* — Stephen E. Jones
(74) *Attorney, Agent, or Firm* — Larson Newman, LLP

(57) ABSTRACT

A printed circuit board includes vias of first and second differential pairs, and vias of third and fourth differential pairs. The vias of the first and second differential pairs are arranged in a first via pattern based on a first crosstalk signature of a first connector to be coupled to the vias of the first and second differential pairs. The vias of the third and fourth differential pairs are arranged in a second via pattern based on a second crosstalk signature of a second connector to be coupled to the vias of the third and fourth differential pairs.

20 Claims, 8 Drawing Sheets

PRINTED CIRCUIT BOARD VIA DESIGN

CROSS REFERENCE TO RELATED APPLICATION

Related subject matter is contained in co-pending U.S. patent application Ser. No. 15/251,569 entitled "Printed Circuit Board Connector with Cross-Talk Mitigation," filed of even date herewith, the disclosure of which is hereby incorporated by reference.

FIELD OF THE DISCLOSURE

The present disclosure generally relates to information handling systems, and more particularly relates to a printed circuit board via design.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems.

SUMMARY

A printed circuit board includes vias of first and second differential pairs, and vias of third and fourth differential pairs. The vias of the first and second differential pairs are arranged in a first via pattern based on a first crosstalk signature of a first connector to be coupled to the vias of the first and second differential pairs. The vias of the third and fourth differential pairs are arranged in a second via pattern based on a second crosstalk signature of a second connector to be coupled to the vias of the third and fourth differential pairs.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
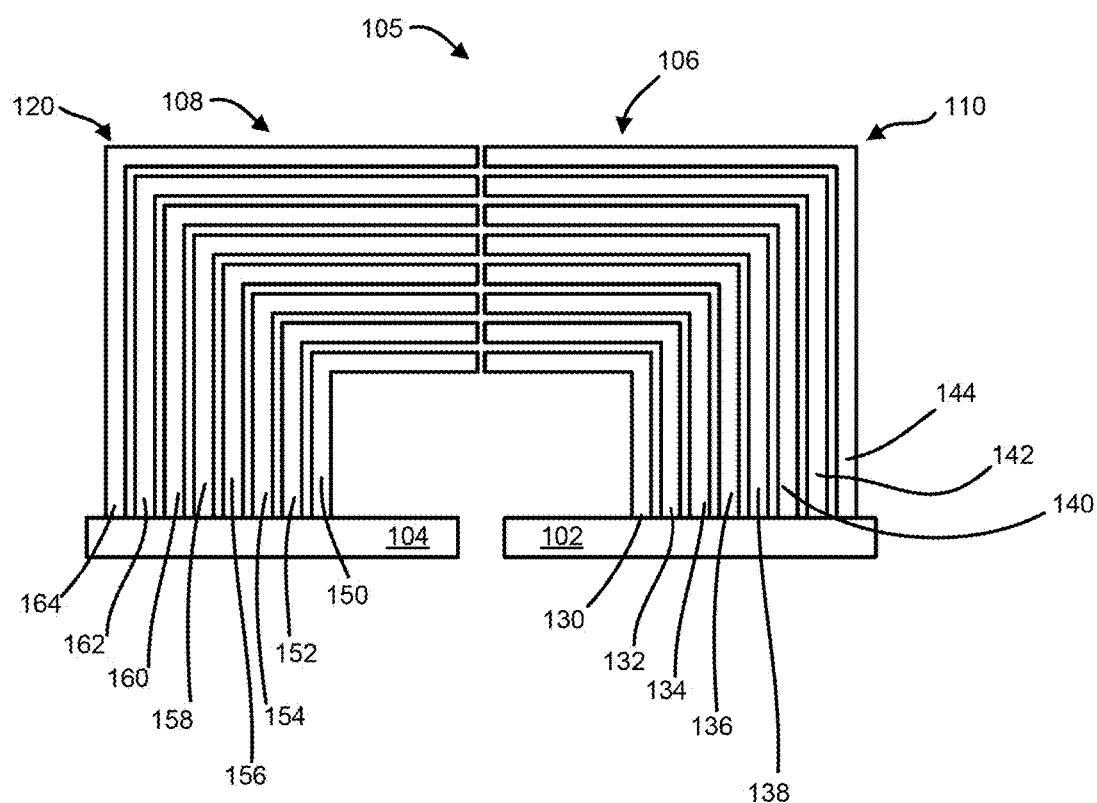
FIG. 1 is a schematic side view of two printed circuit boards connected by an embodiment of a connector according to an embodiment of the present disclosure.

FIG. 1 shows printed circuit boards (PCBs) 102 and 104 of an information handling system. The PCBs 102 and 104 are placed in communication with each other by a connector 105. For purposes of this disclosure, the information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer (desktop, laptop, all-in-one computer, etc.), a consumer electronic device, a network server or storage device, a switch router, wireless router, or other network communication device, a network connected device (cellular telephone, tablet device, etc.), or any other suitable device, and can vary in size, shape, performance, price, and functionality and price. The information handling system can also be implemented as or incorporated into various devices, such as a laptop computer, a tablet computer, a set-top box (STB), a mobile information handling system, a palmtop computer, a desktop computer, a communications device, a wireless telephone, a smart phone, a wearable computing device, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the information handling system can be implemented using electronic devices that provide voice, video or data communication. Further, while a single information handling system is illustrated in FIG. 1, the term "system" shall also be taken to include any collection of systems or sub-systems that individually or jointly execute a set, or multiple sets, of instructions to perform one or more computer functions.

The PCBs 102 and 104 can be horizontally aligned PCBs that include surface terminals to connect with the connector 105, which in turn can include a plug 106 and a receptacle 108. The plug 106 can include multiple layers or wafers, such as wafer 110, and each wafer can include multiple communication channels. Similarly, the receptacle 108 can include multiple layers or wafers, such as wafer 120, and each wafer can include multiple communication channels. Each wafer, such as wafer 110, of the plug 106 can include a particular number of communication channels, such 8, 10, 12, 14, 16, or the like. For example, wafer 110 includes communication channels 130, 132, 134, 136, 138, 140, 142, and 144 (130-144). Each wafer, such as wafer 120, of the receptacle 108 can include a particular number of communication channels, such 8, 10, 12, 14, 16, or the like. For example, wafer 120 includes communication channels 150, 152, 154, 156, 158, 160, 162, and 164 (150-164).

The communication channels 130-144 can alternate in the polarity of the signal carried by the communication channels. For example, communication channel 130 can be a positive communication channel, communication channel 132 can be a negative communication channel, communication channel 134 can be a positive communication channel, communication channel 136 can be a negative communication channel, communication channel 138 can be a positive communication channel, communication channel 140 can be a negative communication channel, communication channel 142 can be a positive communication channel, and communication channel 144 can be a negative communication channel.

The communication channels 130-144 can be connected to the communication channels 150-164 to complete the communication channels in the connector 105. The communication channels 130-144 and 150-164 can also be grouped as differential pairs, such that a positive channel is paired with a negative channel. For example, communication channels 130 and 132 can be one differential pair in wafer 110 coupled to the differential pair of communication channels 150 and 152 in wafer 120, communication channels 134 and 136 can be another differential pair coupled to the differential pair of communication channels 154 and 156, communication channels 138 and 140 can be another differential pair coupled to the differential pair of communication channels 158 and 160, and communication channels 142 and 144 can be still another differential pair coupled to the differential pair of communication channels 162 and 164.

The PCBs 102 and 104 can support a large range of high speed communication signals, such as 25-56 Gigabits per second (Gbps), 64 Gbps, or the like. The communication channel transmitting high speed communication signals can generate problems with signal quality. Some types of signal degradation of the signal can include insertion loss, return loss, jitter, crosstalk, and the like. The communication channels 130-144 and 150-164 in the connector 105 can also create crosstalk between communication signals on nearby differential pairs. For example, the signal on the differential pair of communication channels 130, 132, 150, and 152 can create crosstalk with the signal on the differential pair of communication channels 134, 136, 154, and 156. In an embodiment, the crosstalk between differential pairs in a single wafer, such as the combination of wafers 110 and 120, in the connector 105 can be reduced by crisscrossing every other differential pair in the wafer, as discussed below with respect to FIGS. 2-4. In another embodiment, the crosstalk between differential pairs in a single wafer, such as the combination of wafers 110 and 120, in the connector 105 can be reduced by varying via patterns in the PCB, such as PCB 102 or 104, as discussed below with respect to FIGS. 5-7.

Figure 2:
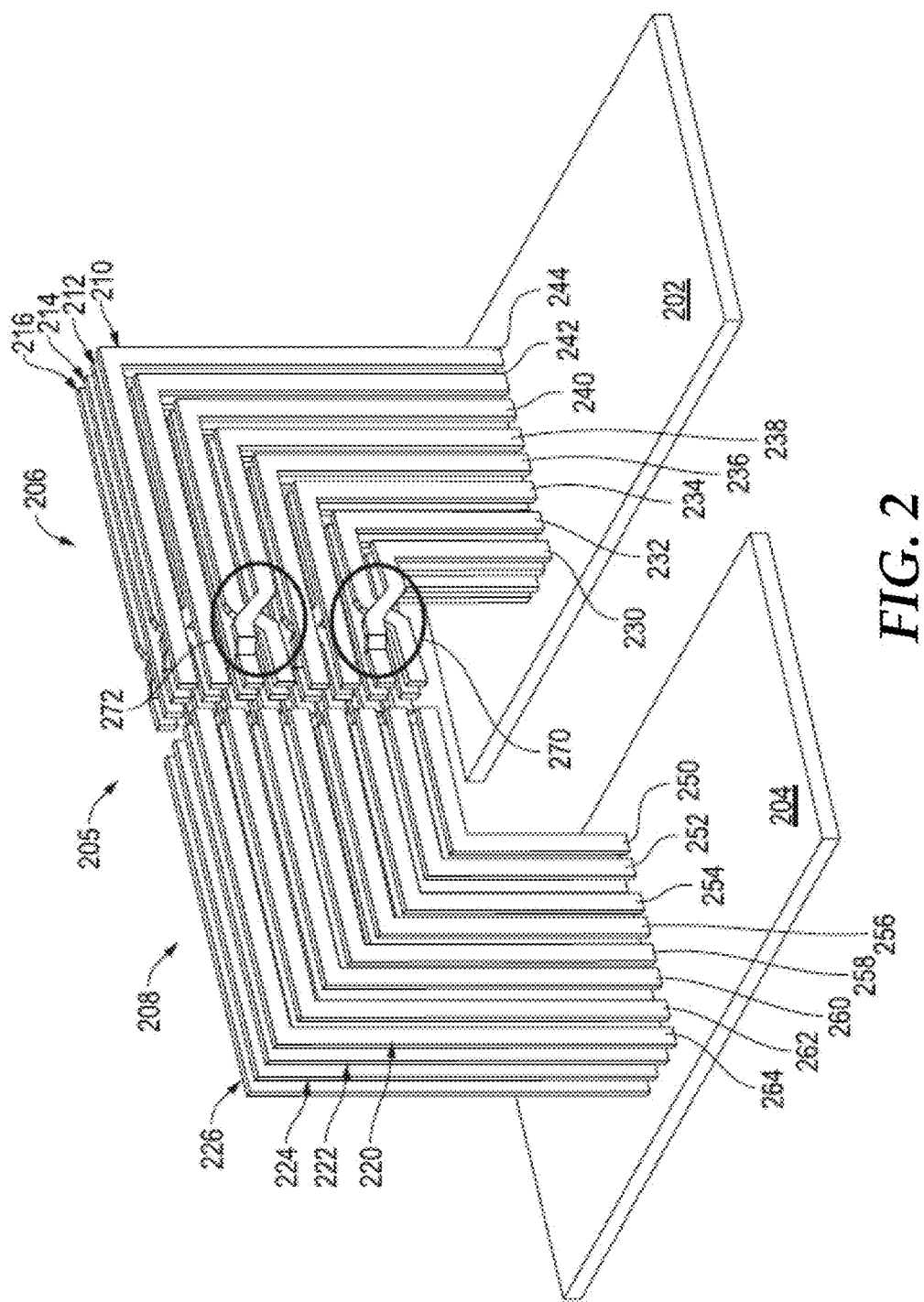
FIG. 2 is a schematic perspective view of two printed circuit boards connected by another embodiment of a connector according to an embodiment of the present disclosure.

Referring now to FIG. 2, PCBs 202 and 204 of an information handling system are placed in communication with each other by a connector 205. The PCBs 202 and 204 can be horizontally aligned PCBs that include surface terminals to connect with the connector 205, which in turn can include a plug 206 and a receptacle 208. The plug 206 can include multiple layers or wafers 210, 212, 214, and 216 (210-216), and each wafer can include multiple communication channels. Similarly, the receptacle 208 can include multiple layers or wafers 220, 222, 224, and 226 (220-226), and each wafer can include multiple communication channels. Each wafer 210-216 of the plug 206 can include a particular number of communication channels, such 8, 10, 12, 14, 16, or the like. For example, wafer 210 includes communication channels 230, 232, 234, 236, 238, 240, 242, and 244 (230-244). Each wafer 220-226 of the receptacle 208 can include a particular number of communication channels, such 8, 10, 12, 14, 16, or the like. For example, wafer 220 includes communication channels 250, 252, 254, 256, 258, 260, 262, and 264 (250-264).

In an embodiment, the crosstalk between differential pairs in a single wafer, such as the combination of wafers 210 and 220, in the connector 205 can be reduced by crisscrossing every other differential pair in the wafer. In an embodiment, the crisscross can be a particular location within the differential pair, such as half the length of the differential pair. For example, a crisscross 270 can be located at the predetermined location of the differential pair of communication channels 230, 232, 250, and 252. The next differential pair of communication channels 234, 236, 254, and 256 does not include a crisscross. The crisscross 270 can flip the polarity of the signal in the differential pair of communication channels 230, 232, 250, and 252, while the polarity of the signal in the next differential pair of communication channels 234, 236, 254, and 256 does not change. Thus, the flipping of the polarity of one signal but not the next signal can negate the crosstalk within the combination of wafers 210 and 220.

Similarly, a crisscross 272 can be located at the predetermined location of the differential pair of communication channels 238, 240, 258, and 260. While the next differential pair of communication channels 242, 244, 262, and 264 does not include a crisscross. The crisscross 272 can flip the polarity of the signal in the differential pair of communication channels 238, 240, 258, and 260, while the polarity of the signals in the neighboring differential pairs of communication channels 234, 236, 254, and 256 and communication channels 242, 244, 262, and 264 do not change. Thus, the flipping of the polarity of one signal but not the neighboring signals can negate the crosstalk within the combination of wafers 210 and 220.

Thus, the crisscrosses 270 and 272 cause the communication channels 250-264 to not completely alternate in the polarity of the signal carried from one communication channel to the next. For example, communication channel 250 can be a negative communication channel, communication channel 252 can be a positive communication channel, communication channel 254 can be a positive communication channel, communication channel 256 can be a negative communication channel, communication channel 258 can be a negative communication channel, communication channel 260 can be a positive communication channel, communication channel 262 can be a positive communication channel, and communication channel 264 can be a negative communication channel. In an embodiment, the crosstalk between differential pairs in the combination of wafers 212 and 222, between differential pairs in the combination of wafers 214 and 224, and between differential pairs in the combination of wafers 216 and 226 can be negated by crisscrossing alternating differential pairs in each wafer of the connector 205 in a similar manner as described for the combination of wafers 210 and 220.

Figure 3:
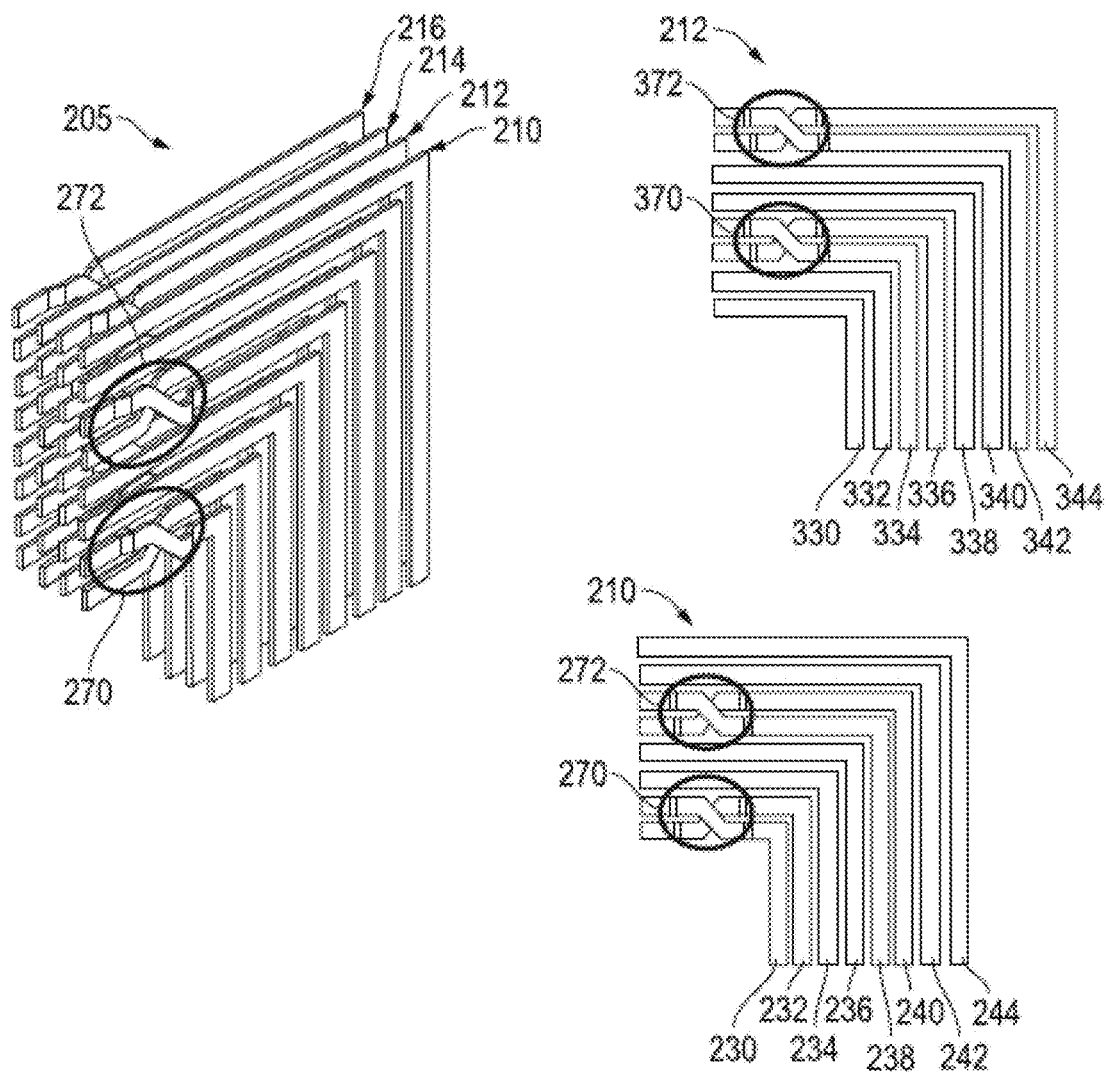
FIG. 3 is a diagram of showing a partially exploded view of the connector according to an embodiment of the present disclosure.

FIG. 3 shows the connector 205 according to an embodiment of the present disclosure. In an embodiment, the crosstalk between neighboring differential pairs between two wafers, such as wafers 210 and 212, in the connector 205 can be reduced by crisscrossing differential pair in every other wafer. For example, the crisscross 270 can be located at a predetermined location of the differential pair of communication channels 230 and 232. However, the differential pair in the wafer 212, such as communication channels 330 and 332, does not include a crisscross. The crisscross 270 can flip the polarity of the signal in the differential pair of communication channels 230 and 232 of wafer 210, while the polarity of the signal in the differential pair of communication channels 330 and 332 in wafer 212 does not change. Thus, the flipping of the polarity of a signal in one wafer but not the neighboring signal adjacent wafer can negate the crosstalk between wafers 210 and 212.

The differential pair of communication channels 234 and 236 does not include a crisscross. Instead, the neighboring different pair of communication channels 334 and 336 does include a crisscross 370. Thus, the flipping of the polarity of a signal on the differential pair of communication channels 334 and 336 of wafer 212 but not the neighboring signal in the different pair of communication channels 234 and 236 of wafer 210 can negate the crosstalk between these neighboring differential pairs of wafers 210 and 212.

A crisscross 272 can be located at a predetermined location of the differential pair of communication channels 238 and 240. However, the neighboring differential pair of communication channels 338 and 340 in the wafer 212 does not include a crisscross. The crisscross 272 can flip the polarity of the signal in the differential pair of communication channels 238 and 240 of wafer 210, while the polarity of the signal in the differential pair of communication channels 338 and 340 in wafer 212 does not change. Thus, the flipping of the polarity of a signal in the differential pair of communication channels 238 and 240 of wafer 210 but not the neighboring signal in the adjacent differential pair of communication channels 338 and 340 in wafer 212 can negate the crosstalk between wafers 210 and 212.

The differential pair of communication channels 242 and 244 does not include a crisscross. Instead, the neighboring different pair of communication channels 342 and 344 does include a crisscross 372. Thus, the flipping of the polarity of a signal on the differential pair of communication channels 342 and 344 of wafer 212 but not the neighboring signal in the different pair of communication channels 242 and 244 of wafer 210 can negate the crosstalk between these neighboring differential pairs of wafers 210 and 212. In an embodiment, the crosstalk between wafers 212 and 214, and between wafers 214 and 216 can be negated by crisscrossing differential pairs in alternating wafers in a similar manner as described for the combination of wafers 210 and 212.

Figure 4:
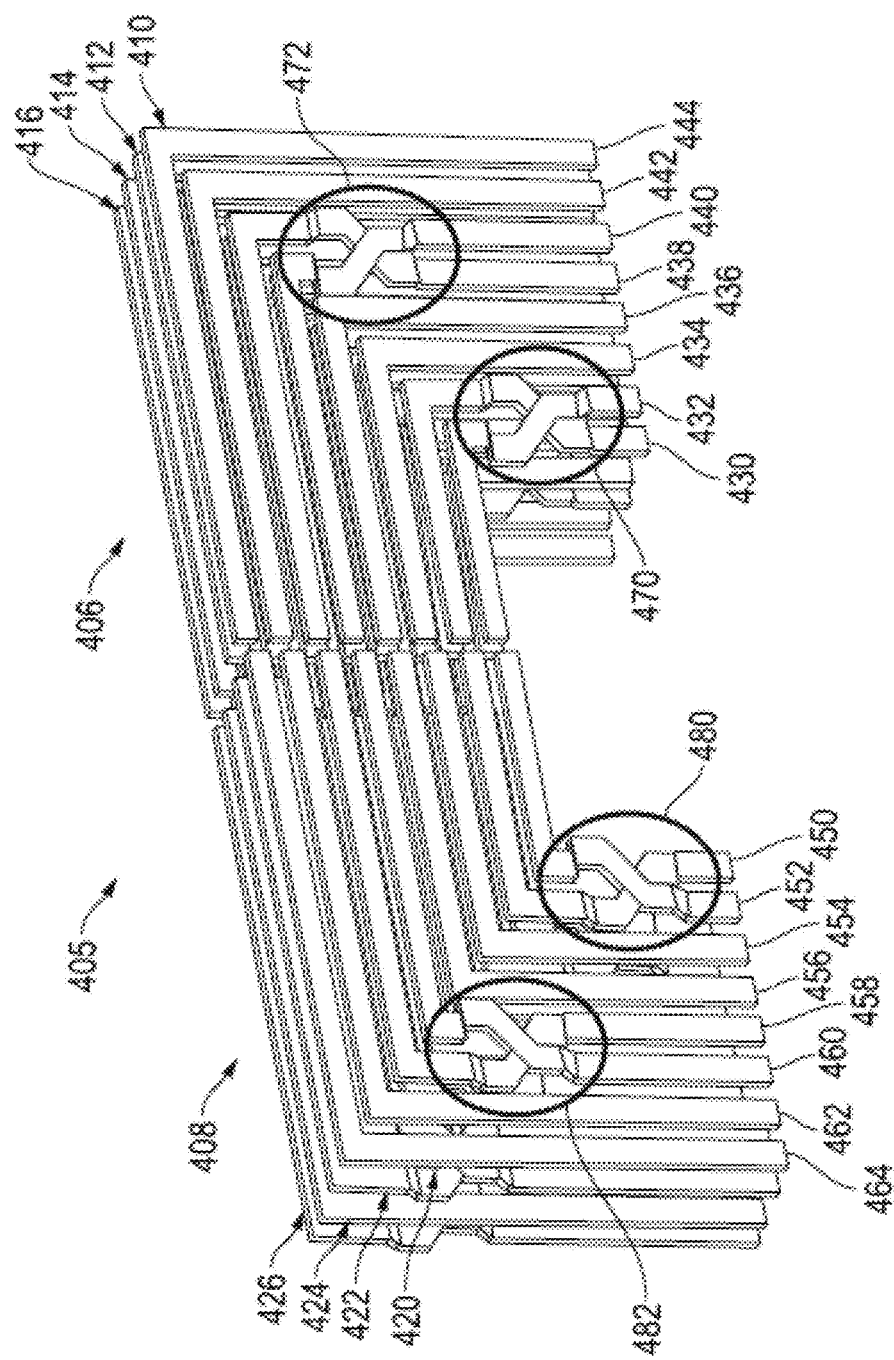
FIG. 4 is a schematic perspective view of another embodiment of the connector according to an embodiment of the present disclosure.

FIG. 4 shows a connector 405 according to an embodiment of the present disclosure. The connector 405 includes a plug 406 and a receptacle 408. The plug 406 can include multiple layers or wafers 410, 412, 414, and 416 (410-416), and each wafer can include multiple communication channels. Similarly, the receptacle 408 can include multiple layers or wafers 420, 422, 424, and 426 (420-426), and each wafer can include multiple communication channels. Each wafer 410-416 of the plug 406 can include a particular number of communication channels, such 8, 10, 12, 14, 16, or the like. For example, wafer 410 includes communication channels 430, 432, 434, 436, 438, 440, 442, and 444 (430-444). Each wafer 420-426 of the receptacle 408 can include a particular number of communication channels, such 8, 10, 12, 14, 16, or the like. For example, wafer 420 includes communication channels 450, 452, 454, 456, 458, 460, 462, and 464 (450-464).

The communication channels 430-444 can be connected to the communication channels 450-464 to complete the communication channels in the connector 405. The communication channels 430-444 and 450-464 can also be grouped as differential pairs, such that a positive channel is paired with a negative channel. For example, communication channels 430 and 432 can be one differential pair in wafer 410 coupled to the differential pair of communication channels 450 and 452 in wafer 420, communication channels 434 and 436 can be another differential pair coupled to the differential pair of communication channels 454 and 456, communication channels 438 and 440 can be another differential pair coupled to the differential pair of communication channels 458 and 460, and communication channels 442 and 444 can be still another differential pair coupled to the differential pair of communication channels 462 and 464.

The communication channels 430-444 and 450-464 in the connector 405 can create crosstalk between communication signals on nearby differential pairs. For example, the signal on the differential pair of communication channels 430, 432, 450, and 452 can create crosstalk with the signal on the differential pair of communication channels 434, 436, 454, and 456.

In an embodiment, the crosstalk between differential pairs in a single wafer, such as the combination of wafers 410 and 420, in the connector 405 can be reduced or negated by crisscrossing every other differential pair in the wafer. In an embodiment, the crisscrossing can be in multiple locations within the differential pair, such as a quarter of the length and three-quarter of the length of the differential pair. For example, a crisscross 470 can be located at a first predetermined location of the differential pair of communication channels 430, 432, 450, and 452, and a crisscross 480 can be located at a second predetermined location of the differential pair of communication channels 430, 432, 450, and 452. The next differential pair of communication channels 434, 436, 454, and 456 does not include a crisscross. The crisscross 470 can flip the polarity of the signal and the crisscross 480 can again flip the polarity of the signal in the differential pair of communication channels 430, 432, 450, and 452, while the polarity of the signal in the next differential pair of communication channels 434, 436, 454, and 456 does not change. Thus, flipping the polarity of one signal twice but not the next signal can negate the crosstalk within the combination of wafers 410 and 420.

Similarly, a crisscross 472 can be located at a first predetermined location of the differential pair of communication channels 438, 440, 458, and 460, and a crisscross 482 can be located at a second predetermined location of the differential pair of communication channels 438, 440, 458, and 460. While the next differential pair of communication channels 442, 444, 462, and 464 does not include a crisscross. The crisscrosses 472 and 482 can flip the polarity of the signal in the differential pair of communication channels 438, 440, 458, and 460 two times, while the polarity of the signals in the neighboring differential pairs of communication channels 434, 436, 454, and 456 and communication channels 442, 444, 462, and 464 do not change. Thus, the flipping of the polarity of one signal but not the neighboring signals can negate the crosstalk within the combination of wafers 410 and 420. In an embodiment, the crosstalk between differential pairs in the combination of wafers 412 and 422, between differential pairs in the combination of wafers 414 and 424, and between differential pairs in the combination of wafers 416 and 426 can be negated by crisscrossing alternating differential pairs in each wafer of the connector 405 multiple times and in a similar manner as described for the combination of wafers 410 and 420.

Figure 5:
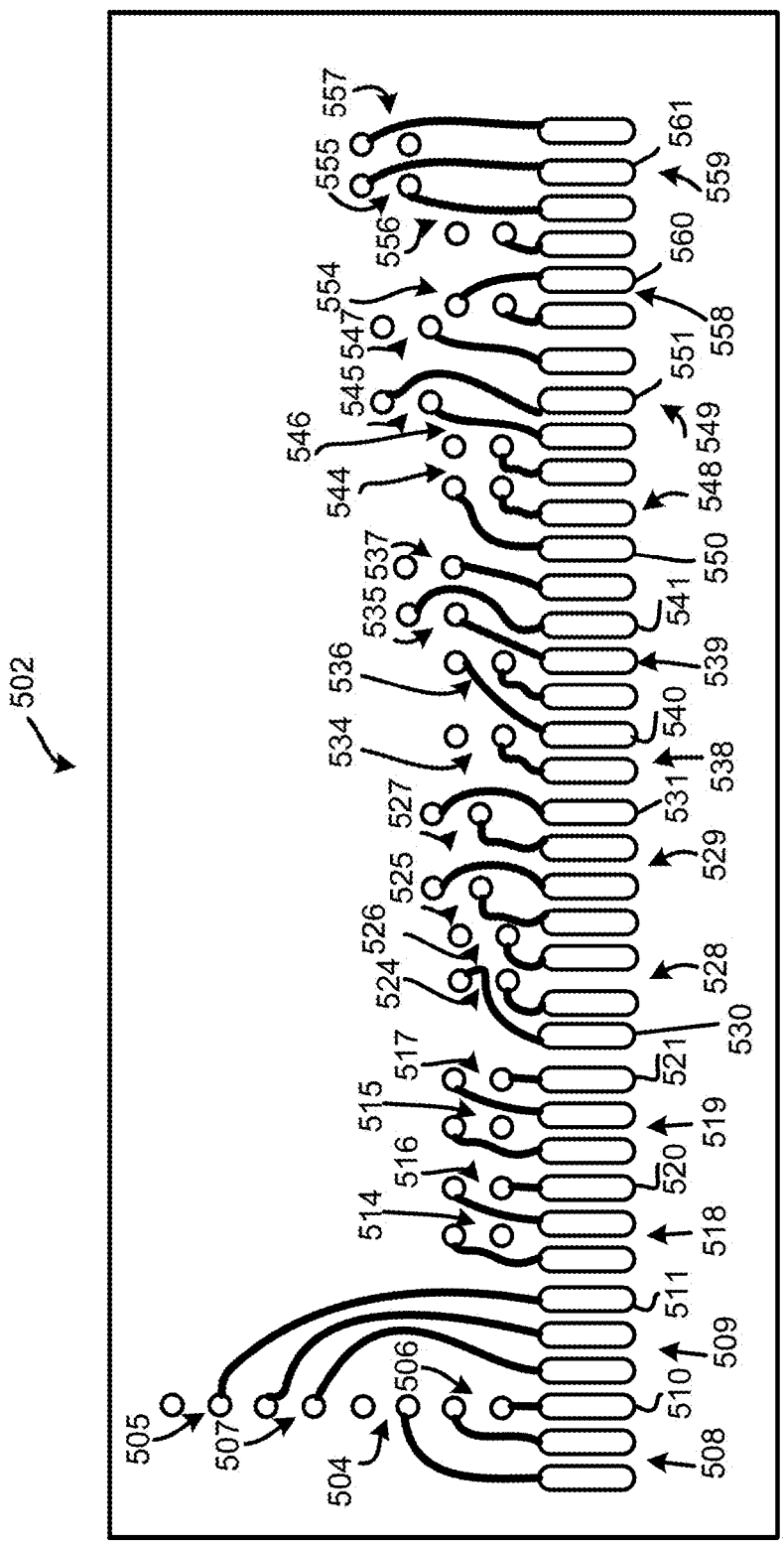
FIG. 5 is a diagram of a printed circuit board including vias for connecting a connector to the printed circuit board according to an embodiment of the present disclosure.

FIG. 5 shows a printed circuit board (PCB) 502 including multiple vias 504, 505, 506, 507, 514, 515, 516, 517, 524, 525, 526, 527, 534, 535, 536, 537, 544, 545, 546, 547, 554, 555, 556, and 557 to connect a connector, such as connector 105, to the printed circuit board according to an embodiment of the present disclosure. The connector can be a surface-mount technology connector, a pin through-hole technology connector, a press-fit technology connector, or the like. The vias can be grouped in differential pairs with a ground plane to form different via patterns. For example, vias 504 and 506 can be grouped as a differential pair 508 with a ground panel 510, vias 505 and 507 can be grouped as a differential pair 509 with a ground panel 511, vias 514 and 516 can be grouped as a differential pair 518 with a ground panel 520, vias 515 and 517 can be grouped as a differential pair 519 with a ground panel 521, vias 524 and 526 can be grouped as a differential pair 528 with a ground panel 530, vias 525 and 527 can be grouped as a differential pair 529 with a ground panel 531, vias 534 and 536 can be grouped as a differential pair 538 with a ground panel 540, vias 535 and 537 can be grouped as a differential pair 539 with a ground panel 541, vias 544 and 546 can be grouped as a differential pair 548 with a ground panel 550, vias 545 and 547 can be grouped as a differential pair 549 with a ground panel 551, vias 554 and 556 can be grouped as a differential pair 558 with a ground panel 560, and vias 555 and 557 can be grouped as a differential pair 559 with a ground panel 561.

In an embodiment, the pair of vias can each be arranged in one of multiple different patterns. In an embodiment, the number of via patterns can be 4, 6, 8, 10, or the like. In an embodiment, the orientation of the vias for a differential pair, with respect to the vias of the other differential pair in the pattern, can differ from one pattern to the next. For example, vias 504 and 506 of differential pair 508 are placed in a straight pattern with vias 505 and 507 of differential pair 509, vias 514 and 516 of differential pair 518 are placed in a parallel pattern with vias 515 and 517 of differential pair 519, vias 524 and 526 of differential pair 528 are placed in a half via staggered parallel pattern with vias 525 and 527 of differential pair 529, vias 534 and 536 of differential pair 538 are placed in a one via staggered parallel pattern with vias 535 and 537 of differential pair 539, vias 544 and 546 of differential pair 548 are placed in a two via staggered parallel pattern with vias 545 and 547 of differential pair 549, and vias 554 and 556 of differential pair 558 are placed in a two and a half via staggered parallel pattern with vias 555 and 557 of differential pair 559.

The different patterns can each create a different crosstalk signature between two differential pairs on signals transmitting through the PCB 502. In an embodiment, the crosstalk between the signals can reduce the signal quality of those signals. During a testing operation of the PCB 102 or a simulation of a PCB, signals can be transmitted by the different via patterns to determine a crosstalk signature between two differential pairs for each via pattern. The crosstalk signature can include data indicating attenuation of the signals at different frequencies. These crosstalk signatures can be stored in a memory, such as memory 804 in FIG. 8 below, for use during the design of the PCB 502.

During a design stage of the PCB 502, one or more connectors, such as connector 105 of FIG. 1, can be identified as connectors that are going to attach to the PCB. The connectors can be a surface-mount technology connector, a pin through-hole technology connector, a press-fit technology connector, or the like. A crosstalk signature for each of the connectors can be determined. In an embodiment, the connectors can multiple different crosstalk signatures, such as the crosstalk signatures represented waveforms in FIG. 6 below.

Figure 6:
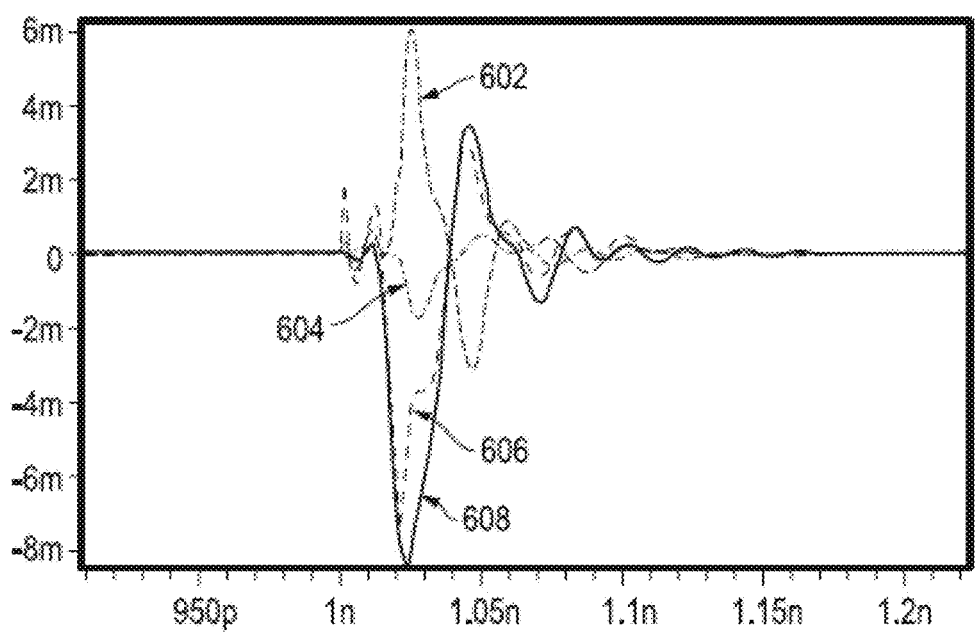
FIG. 6 is a graph showing a plurality of waveforms of different crosstalk signatures created in a connector according to an embodiment of the present disclosure.

FIG. 6 shows the waveforms 602, 604, 606, and 608 of different crosstalk signatures created in different connectors according to an embodiment of the present disclosure. In an embodiment, waveform 602 represents a crosstalk signature that large positive spike followed by a smaller negative spike. Waveform 604 represents a different crosstalk signature that a small negative spike followed by a smaller positive spike. Waveform 606 represents a different crosstalk signature that large negative spike followed by a smaller positive spike. Similarly, waveform 608 represents a different crosstalk signature that large negative spike followed by a smaller positive spike. These calculated crosstalk signatures can be utilized in designing via patterns in the PCB 502.

Referring back to FIG. 5, if a determination is made that a connector with a crosstalk signature represented, by waveform 608, is to be coupled to vias 504-507 of differential pairs 508 and 509, then vias 504-507 can be designed in the straight pattern, as shown in FIG. 5. If a determination is made that a connector with a crosstalk signature represented, by waveform 602, is to be coupled to vias 514-517 of differential pairs 518 and 519, then vias 514-517 can be designed in the parallel pattern, as shown in FIG. 5. The crosstalk signature for the connectors to be coupled to the other via groups 524-527 of differential pairs 528 and 529, 534-537 of differential pairs 538 and 539, 544-547 of differential pairs 548 and 549, and 554-557 of differential pairs 558 and 559 can be determined and the optimal via pattern to negate the crosstalk of the associated connector can designed in the PCB 502. The PCB 502 can then be built with the vias 504-507, 514-517, 524-527, 534-537, 544-547, and 554-557 in the optimized patterns to reduce crosstalk between two adjacent differential pairs in the connectors to be coupled to the PCB.

In an embodiment, the optimizing of via patterns to negate the crosstalk in an associated connector can reduce the near-end and far-end crosstalk by a particular range, such as 20-30 dB. This reduction of the crosstalk in the connector can improve performance by a particular percentage, such as 30%, at higher frequencies of signals transmitting the in the connectors. In an embodiment, the PCB 502 can be designed and built with different combinations of via patterns. For example, each via pair have a different via pattern, as shown in FIG. 5. In another example, all of the via pairs can be grouped with the same via pattern. Thus, depending on the crosstalk signatures of the connector to be coupled to the PCB 502, the PCB can include any combination of via patterns.

Figure 7:
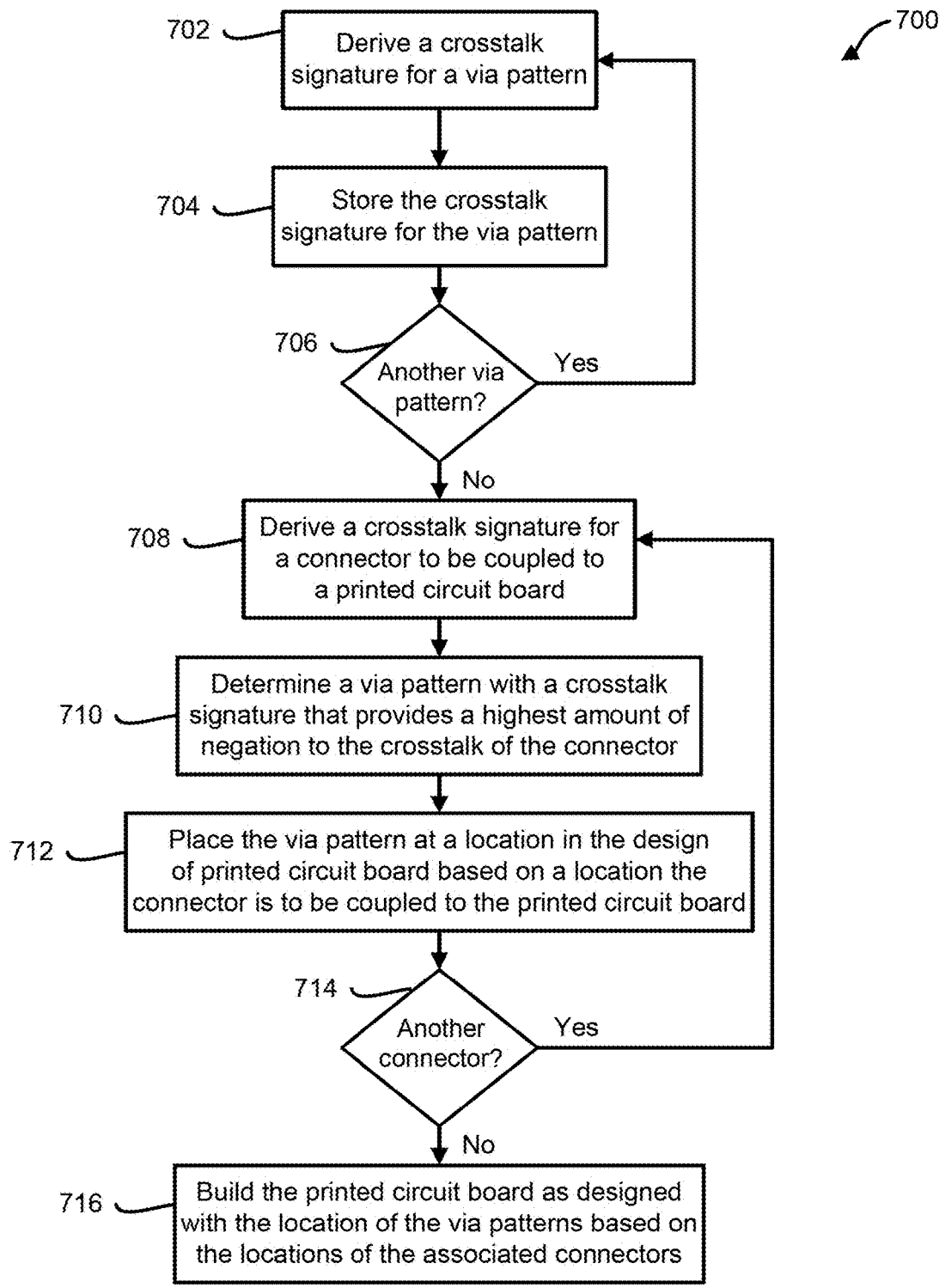
FIG. 7 is a flow diagram of a method for designing a printed circuit board with vias to reduce crosstalk in a connector coupled to the printed circuit board according to an embodiment of the present disclosure.

FIG. 7 shows a method 700 for designing a printed circuit board with vias to reduce crosstalk in a connector coupled to the printed circuit board according to an embodiment of the present disclosure. At block 702, a crosstalk signature is derived for vias of two adjacent differential pairs in a particular via pattern based on signal transmitted by the vias of the differential pairs. In an embodiment, the crosstalk signature can be derived by a calculation. In an embodiment, the via pattern can be a straight pattern, a parallel pattern, a half via staggered parallel pattern, a one via staggered parallel pattern, a two via staggered parallel pattern, a two and a half via staggered parallel pattern, or the like. The crosstalk signature for the via pattern is stored in a memory at block 704. At block 706, a determination is made whether there is another via pattern.

If there is another via pattern, the flow continues as stated above at block 702, otherwise the flow continues as block 708 and a crosstalk signature is derived for a connector to be coupled to the PCB. In an embodiment, the crosstalk signature can be derived by a calculation. At block 710, a via pattern is determined that has a crosstalk signature with a highest amount of negation of the crosstalk of the connector. Thus, the matching of a via pattern to the connector optimizes the reduction of crosstalk in the connector. At block 712, the via pattern is placed in a design of the PCB based on a location the connector is to be coupled to the PCB. At block 714, a determination is made whether another connector is to be coupled to the PCB. If another connector is to be coupled to the PCB, the flow continues as stated above at block 708, otherwise the flow continues at block 716 and the PCB is built based on the design and the locations of the via patterns is based on the location that the associated connectors will be connected to the PCB.

Figure 8:
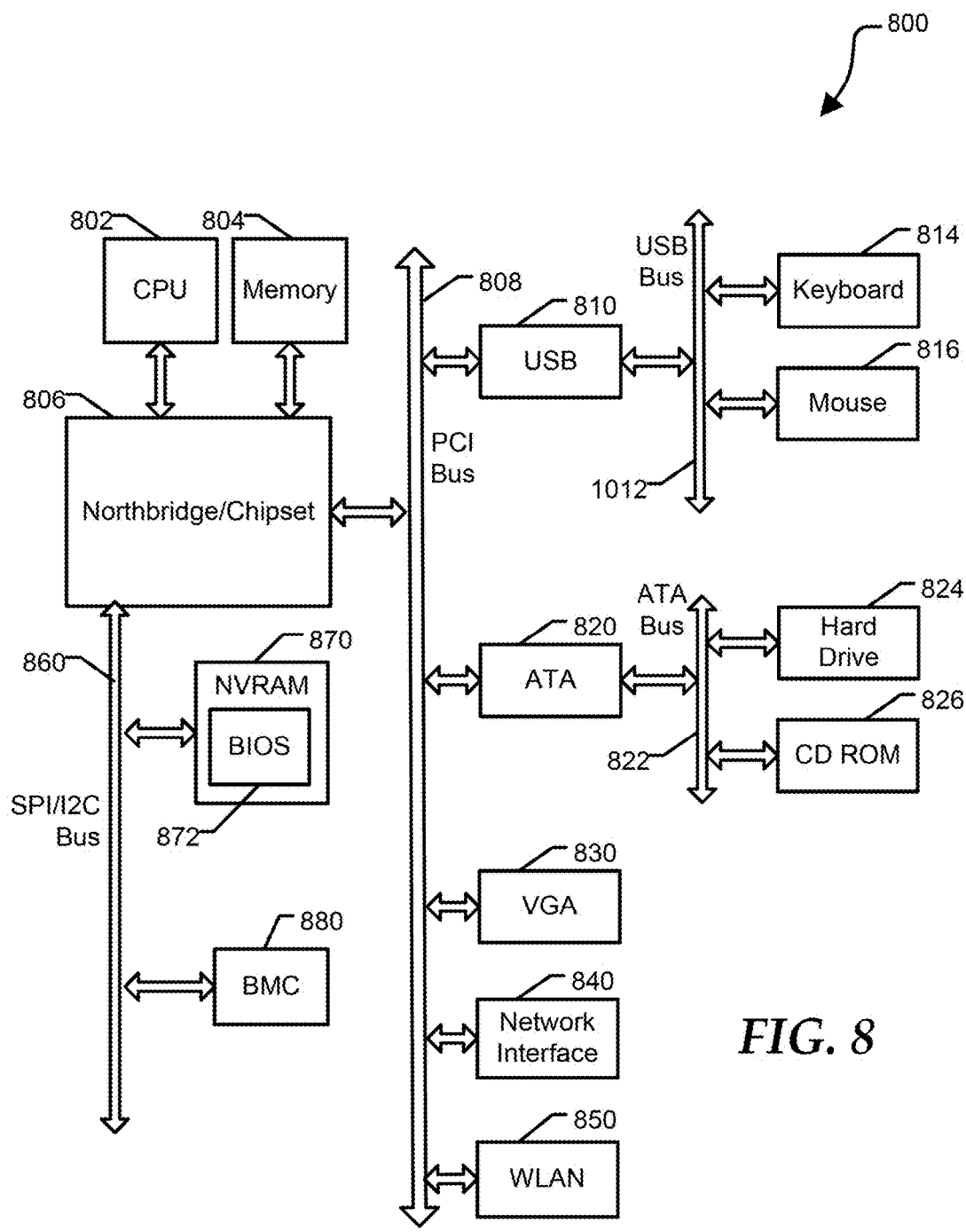
FIG. 8 is a block diagram of a general information handling system according to an embodiment of the present disclosure.

FIG. 8 shows an information handling system 800 including a processor 802, a memory 804, a northbridge/chipset 806, a PCI bus 808, a universal serial bus (USB) controller 810, a USB 812, a keyboard device controller 814, a mouse device controller 816, a configuration an ATA bus controller 820, an ATA bus 822, a hard drive device controller 824, a compact disk read only memory (CD ROM) device controller 826, a video graphics array (VGA) device controller 830, a network interface controller (NIC) 840, a wireless local area network (WLAN) controller 850, a serial peripheral interface (SPI) bus 860, a NVRAM 870 for storing BIOS 872, and a baseboard management controller (BMC) 880. BMC 880 can be referred to as a service processor or embedded controller (EC). Capabilities and functions provided by BMC 880 can vary considerably based on the type of information handling system. For example, the term baseboard management system is often used to describe an embedded processor included at a server, while an embedded controller is more likely to be found in a consumer-level device. As disclosed herein, BMC 880 represents a processing device different from CPU 802, which provides various management functions for information handling system 800. For example, an embedded controller may be responsible for power management, cooling management, and the like. An embedded controller included at a data storage system can be referred to as a storage enclosure processor.

For purpose of this disclosure information handling system 800 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 800 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 800 can include processing resources for executing machine-executable code, such as CPU 802, a programmable logic array (PLA), an embedded device such as a System-on-a-Chip (SoC), or other control logic hardware. Information handling system 800 can also include one or more computer-readable medium for storing machine-executable code, such as software or data.

System 800 can include additional processors that are configured to provide localized or specific control functions, such as a battery management controller. Bus 860 can include one or more busses, including a SPI bus, an I2C bus, a system management bus (SMBUS), a power management bus (PMBUS), and the like. BMC 880 can be configured to provide out-of-band access to devices at information handling system 800. As used herein, out-of-band access herein refers to operations performed prior to execution of BIOS 872 by processor 802 to initialize operation of system 800.

BIOS 872 can be referred to as a firmware image, and the term BIOS is herein used interchangeably with the term firmware image, or simply firmware. BIOS 872 includes instructions executable by CPU 802 to initialize and test the hardware components of system 800, and to load a boot loader or an operating system (OS) from a mass storage device. BIOS 872 additionally provides an abstraction layer for the hardware, such as a consistent way for application programs and operating systems to interact with the keyboard, display, and other input/output devices. When power is first applied to information handling system 800, the system begins a sequence of initialization procedures. During the initialization sequence, also referred to as a boot sequence, components of system 800 are configured and enabled for operation, and device drivers can be installed. Device drivers provide an interface through which other components of the system 800 can communicate with a corresponding device.

Information handling system 800 can include additional components and additional busses, not shown for clarity. For example, system 800 can include multiple processor cores, audio devices, and the like. While a particular arrangement of bus technologies and interconnections is illustrated for the purpose of example, one of skill will appreciate that the techniques disclosed herein are applicable to other system architectures. System 800 can include multiple CPUs and redundant bus controllers. One or more components can be integrated together. For example, portions of northbridge/chipset 806 can be integrated within CPU 802. Additional components of information handling system 800 can include one or more storage devices that can store machine-executable code, one or more communications ports for communicating with external devices, and various input and output (I/O) devices, such as a keyboard, a mouse, and a video display. An example of information handling system 800 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Information handling system 800 can include a set of instructions that can be executed to cause the information handling system to perform any one or more of the methods or computer based functions disclosed herein. The information handling system 800 may operate as a standalone device or may be connected to other computer systems or peripheral devices, such as by a network.

In a networked deployment, the information handling system 800 may operate in the capacity of a server or as a client user computer in a server-client user network environment, or as a peer computer system in a peer-to-peer (or distributed) network environment. The information handling system 800 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 800 can be implemented using electronic devices that provide voice, video or data communication. Further, while a single information handling system 800 is illustrated, the term "system" shall also be taken to include any collection of systems or sub-systems that individually or jointly execute a set, or multiple sets, of instructions to perform one or more computer functions.

The information handling system 800 can include a disk drive unit and may include a computer-readable medium, not shown in FIG. 8, in which one or more sets of instructions, such as software, can be embedded. Further, the instructions may embody one or more of the methods or logic as described herein. In a particular embodiment, the instructions may reside completely, or at least partially, within system memory 804 or another memory included at system 800, and/or within the processor 802 during execution by the information handling system 800. The system memory 804 and the processor 802 also may include computer-readable media.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A printed circuit board comprising:
   vias of first and second differential pairs arranged in a first via pattern, wherein the vias of the first and second differential pairs are arranged in the first via pattern based on a first crosstalk signature of a first connector to be coupled to the vias of the first and second differential pairs; and
   vias of third and fourth differential pairs arranged in a second via pattern, wherein the vias of the third and fourth differential pairs are arranged in the second via pattern based on a second crosstalk signature of a second connector to be coupled to the vias of the third and fourth differential pairs.

2. The printed circuit board of claim 1, wherein the vias of the first and second differential pairs are arranged in the first via pattern further based on a third crosstalk signature of the vias of the first and second differential pairs in the first via pattern.

3. The printed circuit board of claim 1, wherein the vias of the third and fourth differential pairs are arranged in the second via pattern further based on a third crosstalk signature of the vias of the third and fourth differential pairs in the second via pattern.

4. The printed circuit board of claim 1, wherein the first via pattern and the second via pattern are the same via pattern.

5. The printed circuit board of claim 1, wherein the vias of the first and second differential pairs arranged in the first via pattern negates crosstalk in the first connector.

6. The printed circuit board of claim 1, wherein the vias of the third and fourth differential pairs arranged in the second via pattern negates crosstalk in the second connector.

7. The printed circuit board of claim 6, wherein the first via pattern is selected from a group consisting of a straight pattern, a parallel pattern, a half via staggered parallel pattern, a one via staggered parallel pattern, a two via staggered parallel pattern, and a two and a half via staggered parallel pattern.

8. A printed circuit board comprising:
first vias of a first differential pair; and
second vias of a second differential pair arranged in a first via pattern with the first vias, wherein the first and second vias are arranged in the first via pattern based on a first crosstalk signature of a first connector to be coupled to the vias of the first and second differential pairs.

9. The printed circuit board of claim 8, wherein the first and second vias are arranged in the first via pattern further based on a third crosstalk signature of the first and second vias in the first via pattern.

10. The printed circuit board of claim 8, wherein the first and second vias arranged in the first via pattern negates crosstalk in the first connector.

11. The printed circuit board of claim 8, wherein the first via pattern is selected from a group consisting of a straight pattern, a parallel pattern, a half via staggered parallel pattern, a one via staggered parallel pattern, a two via staggered parallel pattern, and a two and a half via staggered parallel pattern.

12. The printed circuit board of claim 8, further comprising:
vias of third and fourth differential pairs arranged in a second via pattern, wherein the vias of the third and fourth differential pairs are arranged in the second via pattern based on a second crosstalk signature of a second connector to be coupled to the vias of the third and fourth differential pairs and based on a third crosstalk signature of the vias of the third and fourth differential pairs in the second via pattern, wherein the vias of the third and fourth differential pairs arranged in the second via pattern negates crosstalk in the second connector.

13. The printed circuit board of claim 12, wherein the first via pattern and the second via pattern are the same via pattern.

14. The printed circuit board of claim 8, wherein the first and second vias are placed at first location of the printed circuit board based on a second location that the first connector is coupled to the printed circuit board.

15. The printed circuit board of claim 14, wherein the first via pattern and the second via pattern are the same via pattern.

16. The printed circuit board of claim 14, wherein the vias of the first and second differential pairs arranged in the first via pattern negates crosstalk in the first connector.

17. The printed circuit board of claim 14, wherein the vias of the third and fourth differential pairs arranged in the second via pattern negates crosstalk in the second connector.

18. The printed circuit board of claim 14, wherein the first via pattern is selected from a group consisting of a straight pattern, a parallel pattern, a half via staggered parallel pattern, a one via staggered parallel pattern, a two via staggered parallel pattern, and a two and a half via staggered parallel pattern.

19. The printed circuit board of claim 14, wherein the first and second vias are placed at first location of the printed circuit board based on a second location that the first connector is coupled to the printed circuit board.

20. A printed circuit board comprising:
vias of first and second differential pairs arranged in a first via pattern, wherein the vias of the first and second differential pairs are arranged in the first via pattern based on a first crosstalk signature of a first connector to be coupled to the vias of the first and second differential pairs and based on a second crosstalk signature of the vias of the first and second differential pairs in the first via pattern; and
vias of third and fourth differential pairs arranged in a second via pattern, wherein the vias of the third and fourth differential pairs are arranged in the second via pattern based on a third crosstalk signature of a second connector to be coupled to the vias of the third and fourth differential pairs and based on a fourth crosstalk signature of the vias of the third and fourth differential pairs in the second via pattern.

* * * * *